US006762963B2

(12) United States Patent
Inoue et al.

(10) Patent No.: US 6,762,963 B2
(45) Date of Patent: Jul. 13, 2004

(54) SEMICONDUCTOR MEMORY HAVING DYNAMIC MEMORY CELLS AND A REDUNDANCY RELIEF CIRCUIT

(75) Inventors: Yoshihiko Inoue, Chikushino (JP); Hisashi Motomura, Fukuoka (JP); Masashi Horiguchi, Koganei (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 15 days.

(21) Appl. No.: 10/192,615

(22) Filed: Jul. 11, 2002

(65) Prior Publication Data

US 2003/0043672 A1 Mar. 6, 2003

(30) Foreign Application Priority Data

Aug. 30, 2001 (JP) ........................................ 2001-261132

(51) Int. Cl.$^7$ ................................................ G11C 7/00
(52) U.S. Cl. .................. 365/200; 365/222; 365/230.09; 365/236
(58) Field of Search ................................ 365/200, 222, 365/230.09, 230.01

(56) References Cited

U.S. PATENT DOCUMENTS 6,078,543 A  * 6/2000  Kim ..................... 365/230.03

6,426,908 B1 * 7/2002  Hidaka ..................... 365/222

FOREIGN PATENT DOCUMENTS

JP             61-71494           9/1984

* cited by examiner

Primary Examiner—Hoai Ho
(74) Attorney, Agent, or Firm—Reed Smith LLP; Stanley P. Fischer, Esq.; Juan Carlos A. Marquez, Esq.

(57) ABSTRACT

A semiconductor memory capable of reducing refresh cycle time, which includes normal memory cells provided at predetermined intersections of plural normal word lines and plural bit lines, and redundant memory cells of redundant word lines and the plural bit lines, a redundancy relief circuit evaluates whether each of an internal address signal for a memory operation and a refresh address signal corresponds to the address of a defective word line of the plural normal word lines. An address selecting circuit switches the defective word line to a redundant word line according to the evaluation result. The redundancy relief circuit then evaluates whether a refresh address added to the refresh address signal corresponds to a defective address, and during refresh, the address selecting circuit selects a normal or redundant word line according to the evaluation result in a preceding cycle.

7 Claims, 6 Drawing Sheets

SEMICONDUCTOR MEMORY HAVING DYNAMIC MEMORY CELLS AND A REDUNDANCY RELIEF CIRCUIT

BACKGROUND OF THE INVENTION

The present invention relates to a semiconductor memory employing dynamic memory cells, and more particularly to technology effectively used for the speedup and lower power consumption of a semiconductor memory having a redundancy circuit.

Although a dynamic random access memory (hereinafter referred to as DRAM) used for various types of electronic equipment has the advantage of having a high level of integration and being low in bit costs, periodical refresh is required to maintain stored information. Accordingly, the DRAM is commonly used together with a memory controller having a refresh command issuing function and is therefore unsuitable for small-scale systems such as cellular phones. As storage elements for small-scale systems, presently, a static random access memory (hereinafter simply referred to as SRAM) is primarily used. However, as portable equipment grows sophisticated, there are increasing demands for larger-capacity storage elements, so that the SRAM has become unsatisfactory in terms of costs.

A method for making it unnecessary to refresh DRAM from the outside is disclosed in Japanese Published Unexamined Patent Application No. Showa 61-71491. This method divides one cycle to two time zones so that refresh is performed in the first half thereof and a read or write operation is performed in the latter half. In this way, a refresh operation can be concealed from the outside and DRAM having low bit costs can be used like SRAM (as pseudo SRAM).

SUMMARY OF THE INVENTION

A problem of the above described prior art is that, when a read/write request comes in, if a memory is being refreshed, a read or write cannot be started until the refresh operation terminates. The coming of a read/write request cannot be anticipated in advance. As the worst case, if a read/write request comes in immediately after a refresh operation is started, access time is increased by a refresh cycle time. To minimize an increase in the access time, it is desirable to minimize a refresh cycle time.

An object of the present invention is to provide a semiconductor memory capable of reducing refresh cycle time. The above described object and other objects and novel features of the present invention will become apparent from the description of the specification and the accompanying drawings.

A typical invention of those disclosed by the present patent application is briefly described below. In a semiconductor memory which includes normal memory cells provided at predetermined intersections of plural normal word lines and plural bit lines, and redundant memory cells provided at predetermined intersections of redundant word lines and the plural bit lines, and in which a redundancy relief circuit evaluates whether each of an internal address signal for a memory operation and a refresh address signal corresponds to the address of a defective word line of the plural normal word lines, and an address selecting circuit switches the defective word line occurring in the normal word line to a redundant word line according to the evaluation result, the redundancy relief circuit evaluates whether a refresh address added by one to the refresh address signal corresponds to a defective address, and during a refresh operation, the address selecting circuit selects a normal word line or redundant word line according to the evaluation result in a preceding cycle.

DESCRIPTION OF THE PREFERRED EMBODIMENTS

Figure 1:
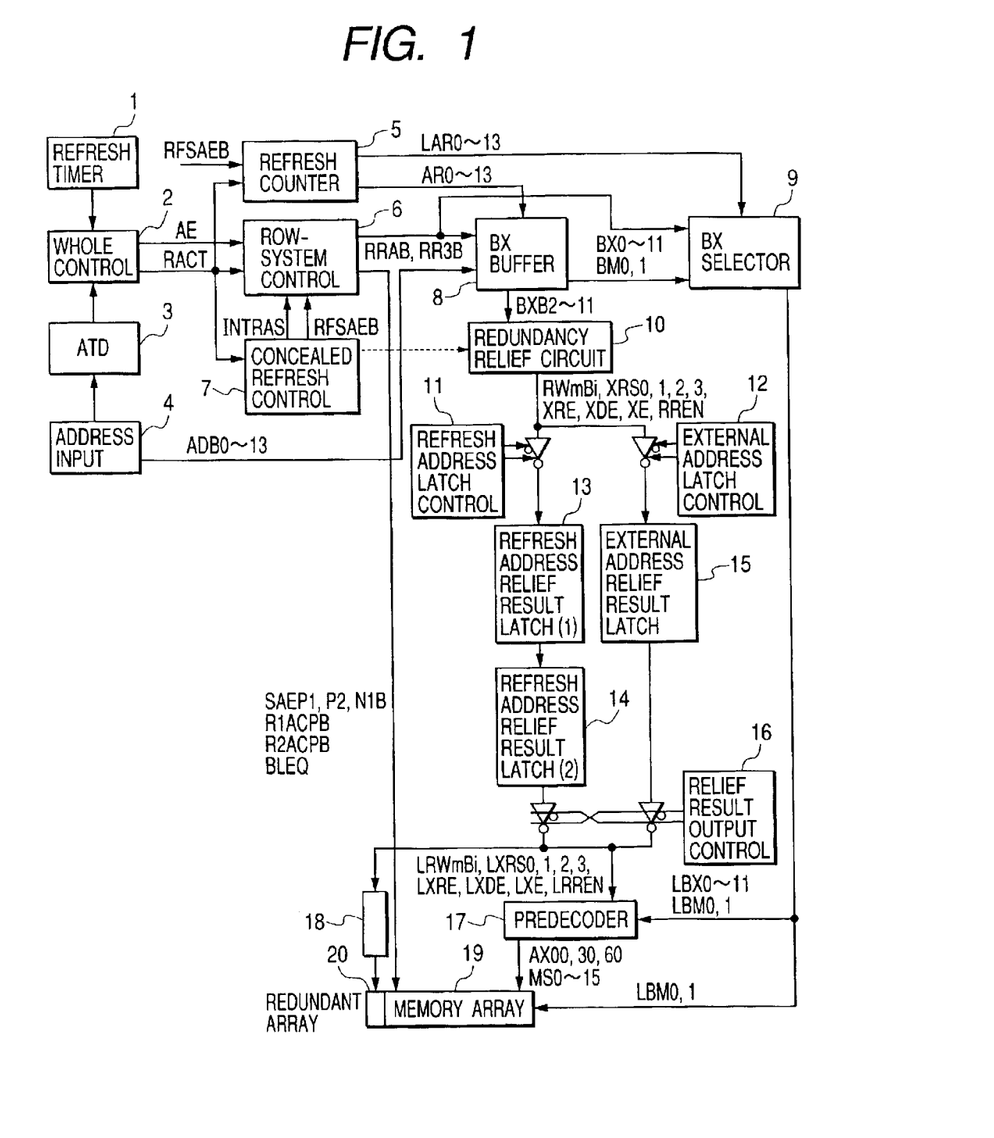
FIG. 1 is a block diagram showing one embodiment of a semiconductor memory according to the present invention.

FIG. 1 is a block diagram showing one embodiment of a semiconductor memory according to the present invention. In the drawing, of dynamic RAMs that employ dynamic memory cells and are compatible with static RAMs, a row (X) system circuit is representatively shown. The row-system circuit includes a refresh counter circuit 5, a row-system control circuit 6, a concealed refresh control circuit 7, a BX buffer circuit 8, a BX selector 9, a redundancy relief circuit 10, latch circuits 13 to 15, a predecoder 17, and a redundancy word driver 18.

An address signal inputted from an external terminal is inputted to an ATD (address signal transition detection) circuit 3 in one hand and to the BX buffer circuit 8 the other hand, via an address input circuit 4. A timing signal generated corresponding to an address signal transition by the ATD 3 is inputted to a whole control circuit 2 as an activation signal for a memory operation. A refresh request signal generated by the refresh timer 1 is also inputted to the whole control circuit 2. Therefore, the whole control circuit 2 generates signals AE and RACT in response to a memory operation and the refresh request signal and supplies them to the refresh counter 5, row-system control circuit 6, and concealed refresh circuit 7.

A counter address output part of the refresh counter 5 includes a circuit for latching individual addresses and increments a counter on the falling edge of a RACT signal generated corresponding to a refresh request signal. Output signals AR0 to AR13 generated by the refresh counter 5 are counter output for a relief evaluation circuit that is incremented on the falling edge of the RACT. Output signals LAR0 to LAR13 generated by the refresh counter 5 are counter output for the predecoder that is incremented on the falling edge of signal RFSAEB.

The counter address output part generates refresh address signals AR0 to AR13 for the relief evaluation circuit that are added by one to refresh addresses LAR0 to LAR13 in a current cycle, generated by the refresh counter 5. That is, refresh address signals AR0 to AR13 for a next cycle are added by one to a refresh address of the current cycle are formed to make redundancy evaluation one memory cycle earlier by the redundancy relief circuit 10, that is, the next word line to be subjected to a refresh operation and the address of a defective word line stored in the redundancy relief circuit 10 are compared to evaluate in advance whether to switch to a redundancy word line.

The row-system control circuit 6 includes word lines for a normal operation and a sense amplifier control circuit, and generates row-system timing signals RRAB and RR3B, sense amplifier activation signals SAEP1, P2, and N1B, and precharge signals R1ACPB, R2ACPB, BLEQ, and the like. The concealed refresh control circuit 7 includes word lines for a concealed refresh operation and a sense amplifier control circuit, and outputs signals INTRAS and RFSAEB to the row-system control circuit 6 while arbitrating a refresh operation and a memory operation.

The BX buffer circuit 8 gets and latches external addresses ADB0 to ADB13 got by the address input circuit 4 during a normal operation and counter addresses AR0 to AR13 during a refresh operation, and propagates these address signals to the redundancy relief circuit 10 and the BX selector 9. The BX selector 9 gets and latches external addresses (BX0 to BX11, and BM0 and BM1) from the BX buffer circuit 8 during a normal operation, and propagates them to the predecoder 17. The BX selector 9 gets and latches counter addresses LAR0 to LAR13 from the refresh counter 5 during a refresh operation, and propagates them to the predecoder 17.

The redundancy relief circuit 10, though there is no particular limitation, includes a comparator for comparing fuse cut information corresponding to the address of a defective word line and an address inputted corresponding to a memory operation or refresh operation.

Upon completion of relief result evaluation for a refresh address of a next cycle during a refresh operation, information about the result is got into the refresh address relief result latch (1) circuit 13. At the falling timing of the RRAB signal in a current refresh cycle, from the latch (1) circuit 13, a refresh address relief evaluation result of the current cycle is propagated to the refresh address relief result latch (2) circuit 14, which latches and passes it to the predecoder by the relief result output control circuit 16.

In this embodiment, as described previously, the counter output part of the refresh counter 5 outputs refresh address signals LAR0 to LAR13 corresponding to a current cycle and refresh address signals AR0 to AR13 for a next cycle that are added by one to them, and inputs the precedent refresh address signals AR0 to AR13 to the redundancy relief circuit 10. Therefore, the result of relief evaluation for a refresh address of the next cycle can be obtained in the course of a refresh operation. By outputting the evaluation result through the two latch circuits 13 and 14, the redundancy comparison evaluation result can be obtained at almost the same time as the refresh address signals LAR0 to LAR13 corresponding to the current cycle.

An external address relief result latch circuit 15 latches a relief evaluation result for external addresses ADB0 to ADB13 during a normal memory operation. After the latch circuit 15 latches the evaluation result, the redundancy relief circuit 10 is reset to immediately start relief evaluation for a next refresh address.

A refresh address latch control circuit 11 and an external address latch control circuit 12 determine in which of the latch circuits 13 and 15 a relief evaluation result is to be stored, depending on whether a refresh operation or normal memory operation is in progress. The relief result output control circuit 16 determines from which of the latch circuits 14 and 15 the relief evaluation result is to be propagated to the predecoder 17, depending on whether a refresh operation or normal memory operation is in progress.

The predecoder 17 determines the address of a memory array 19 from an address signal from the BX selector 9 and a relief evaluation result. In other words, for other than access to a defective word line, the predecoder 17 is activated so that a normal word line of the memory array 19 is selected. For access to a defective word line, normal word line selection by the predecoder 17 is stopped and instead a redundant word line of a redundant array 20 is selected through the redundancy word driver 18.

Row-system operations of the memory circuit of this embodiment are as follows. Transition of address signals is detected by ATD3 and conveyed to the whole control circuit 2. The whole control circuit 2 resets a row address enable signal AE. Resetting the AE signal causes the row-system control circuit 6 to start a reset of a preceding cycle. At this time, when a refresh request is issued from the refresh timer 1, a refresh execution signal RACT is generated by the whole control circuit 2.

Upon receiving the refresh execution signal RACT, the concealed refresh control circuit 7 generates an INTRAS signal, which is an internal RAS. The row-system control circuit 6 generates RRAB and RR3B signals that indicate word rising/falling timings. At the rising timing of the refresh execution signal RACT, the refresh address relief result latch (2) circuit 14 latches information (evaluation result) from the refresh address relief result latch (1) circuit 13.

At the falling timing of the timing signal RRAB, the BX buffer circuit 8 propagates next (plus one) refresh address signals AR0 to AR13 from the refresh counter 5 to the redundancy relief circuit 10 to make relief evaluation. Upon completion of relief evaluation in the redundancy relief circuit 10, in a self-contained manner, evaluation information is latched in the refresh address relief result latch (1) circuit 13. The BX selector 9 gets the current refresh address signals LAR0 to LAR13 from the refresh counter 5 and propagates them to the predecoder 17.

The relief result output control circuit 16 propagates data (evaluation result) of the refresh address relief result latch (2) circuit 14 in a preceding refresh cycle to the predecoder. When refresh address signals LAR0 to LAR13 from the BX selector 9 and relief result output are propagated to the predecoder 10, a selected word line rises and a refresh operation is started. As a result, since there is no wait time involved in relief evaluation, a cycle time can be reduced.

At the falling timing (refresh-time sense amplifier operation timing) of signal RFSAEB, predecoder use output (LAR0 to LAR13) of the refresh counter 5 changes to an address of a next cycle. The BX selector 9 keeps latching the current address. At the falling timing of signals PRAB and RR3B, an address or relief information to the predecoder 10 is reset and a word line WL for refresh falls. At the falling timing of the refresh execution signal RACT, the refresh address relief result latch (2) circuit 14 is connected with the refresh address relief result latch (1) circuit 13 and relief information of the next address is propagated.

During the same memory cycle, the row-system control circuit 6 starts activating a word line corresponding to an external address. In other words, at the falling timing of the signal RRAB, the BX buffer circuit 8 propagates external addresses ADB0 to ADB13 to the redundancy relief circuit to make relief evaluation. Upon completion of the relief evaluation, in a self-contained manner, evaluation information is latched in the external address relief result latch circuit 15. The BX selector 9 gets address signals BX0 to BX11 and BM0 and BM1 from the BX buffer circuit 8 and propagates them to the predecoder 10.

The relief result output control circuit 16 propagates data (evaluation result) of the external address relief evaluation result latch circuit 15 to the predecoder. External address signals BX0 to BX11 and BM0 and BM1 from the BX selector 9, and the relief result output are propagated to the predecoder 10. Therefore, the predecoder 10 activates a word line with a wait time because they are outputted after the relief evaluation completion. A read/write operation is controlled by a column-system circuit.

Figure 2:
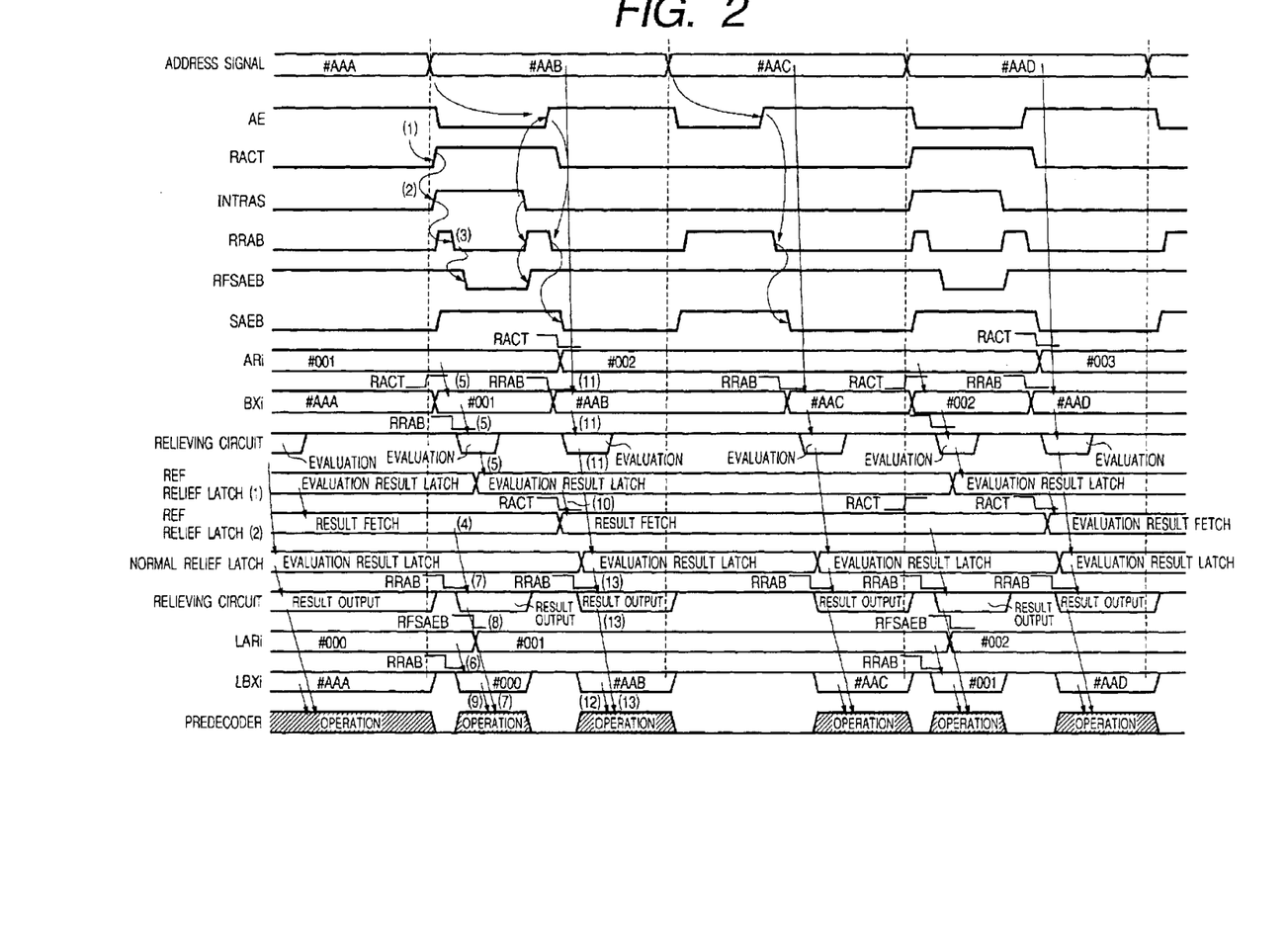
FIG. 2 is a timing diagram for explaining operations of a semiconductor memory according to the present invention.

FIG. 2 is a timing diagram for explaining operations of a semiconductor memory according to the present invention. In this embodiment, in one cycle of external address signal #AAB, as in (1) or (13), a refresh operation is performed in the first half of the cycle and a memory operation is performed in the latter half; in one cycle of external address signal #AAC, only memory operation is performed; and in one cycle of external address signal #AAD, again, a refresh operation is performed in the first half of the cycle and a memory operation is performed in the latter half. The following description uses (1) through (13) in one cycle of the external address signal #AAB as an example.

(1) Upon address transition, a row address enable signal AE is reset by the whole control circuit 2, and the row-system control circuit 2 starts a reset of a preceding cycle. At this time, when a refresh request is issued from the refresh timer 5, a refresh execution signal RACT is generated by the whole control circuit 6.

(2) Upon receiving the refresh execution signal RACT, the concealed refresh control circuit 7 generates an INTRAS signal, which is an internal RAS. (3) The row-system control circuit 6 generates RRAB and RR3B signals that indicate word rising/falling timings. At the rising timing of the refresh execution signal RACT, (4) the refresh address relief result latch (2) circuit 14 latches information from the refresh address relief result latch (1) circuit 13.

At the falling timing of the timing signal RRAB, (5) the BX buffer circuit 8 propagates a next refresh address signal ARi from the refresh counter 5 to the redundancy relief circuit 10 to make relief evaluation. Upon completion of relief evaluation, in a self-contained manner, evaluation information is latched in the refresh address relief result latch (1) circuit 13.

(6) The BX selector 9 gets a current refresh address signal LARi from the refresh counter 5 and propagates it to the predecoder 10. (7) The relief result output control circuit 16 propagates data (evaluation result) of the refresh address relief result latch (2) circuit 14 in a preceding refresh cycle to the predecoder 17. When a refresh address from the BX selector 9 and relief result output are propagated to the predecoder 10, a selected word line rises and a refresh operation is started. When a refresh address from the BX selector 9 and relief result output are propagated to the predecoder 10, a selected word line rises and a refresh operation is started.

At the falling timing of RFSAEB signal, that is, at sense amplifier operation timing during refresh, (8) predecoder use output of the refresh counter 5 changes to an address #001 of a next cycle. Since the BX selector 9 keeps latching the current address, LBXi remains set at #000. At the falling timing of signals RRAB and RR3B, (9) an address or relief information to the predecoder 10 is reset and a word line for refresh falls.

At the falling timing of the refresh execution signal RACT, (10) the refresh address relief result latch (2) circuit 14 is connected with the refresh address relief result latch (1) circuit 13 and relief information of the next address is propagated. The row-system control circuit 6, during the same memory cycle, starts a read or write operation at the external address #AAB. In other words, at the falling timing of the signal RRAB, (11) the BX buffer circuit 8 propagates the external address #AAB to the redundancy relief circuit 10 to make relief evaluation. Upon completion of the relief evaluation, in a self-contained manner, evaluation information is latched in the external address relief result latch circuit 15.

(12) The BX selector 9 gets an address signal BXi from the BX buffer circuit 8 and propagates it to the predecoder 17. (13) The relief result output control circuit 16 propagates data (evaluation result) of the external address relief evaluation result latch circuit 15 to the predecoder 17. At this time, a wait time occurs until a relief evaluation result in the redundancy relief circuit 10 is obtained. After the wait time, an external address from the BX selector 9 and relief result output are propagated to the predecoder and a selected word line rises. Read/write is controlled by the column-system circuit.

Figure 3:
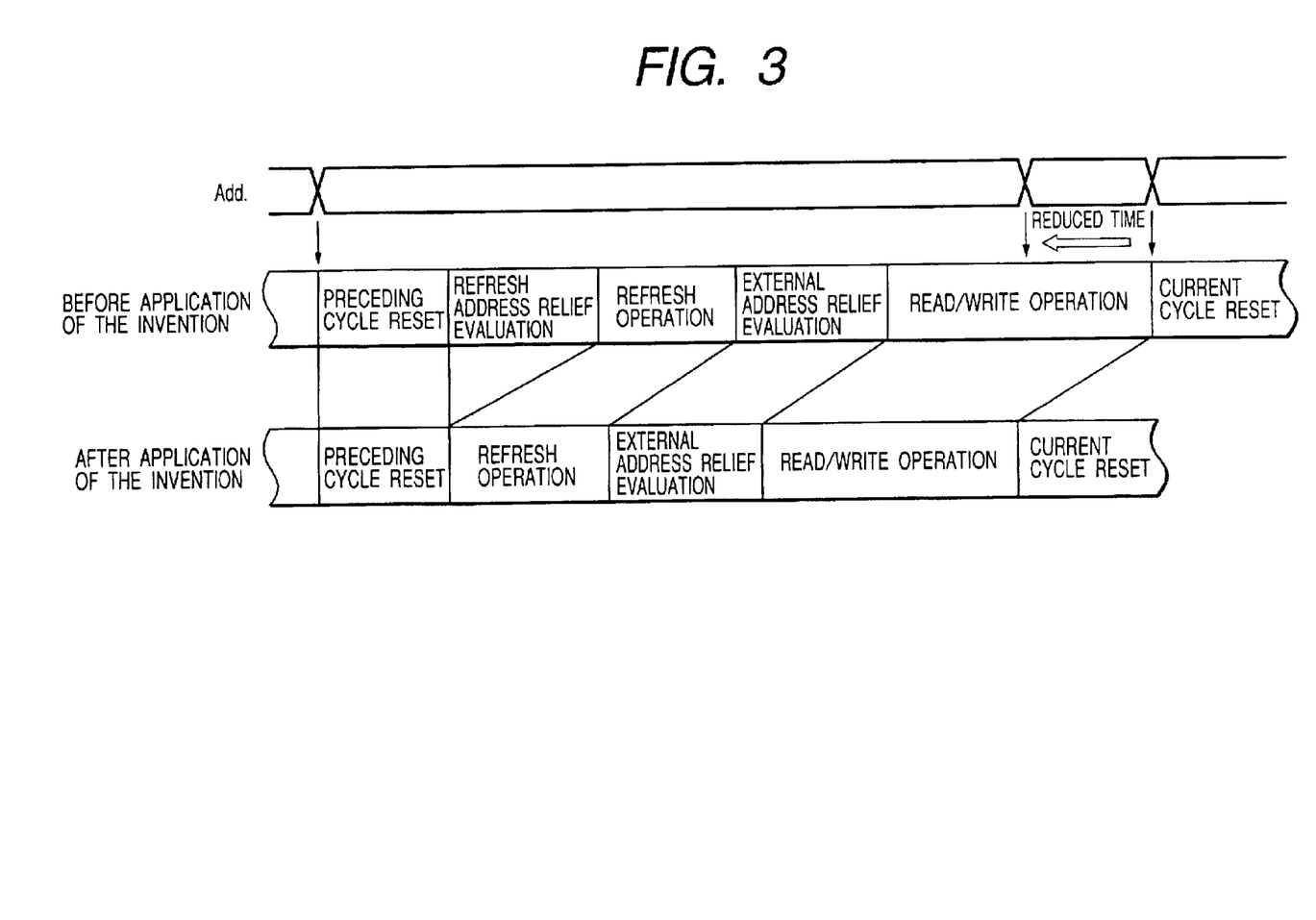
FIG. 3 is a diagram for explaining memory cycles of the semiconductor memory according to the present invention.

FIG. 3 is a diagram for explaining memory cycles of the semiconductor memory according to the present invention. In the semiconductor memory of this embodiment, during one cycle of a memory operation, refresh operations are inserted as required. In other words, upon transition of an external address signal, a word line WL of a preceding cycle is reset, and when an internal refresh timer request occurs, dispersed refresh is performed using an address generated by an internal counter before activating a word line WL of a next cycle, and then the word line WL of the external address is activated. Thereby, a refresh method (concealed refresh) requiring no refresh commands from the outside is employed.

At this time, in the case where a defect relief circuit is provided to switch a defective word line to a redundant word line for each of internal counter address and external address, before the present invention is applied, the activation of a word line WL must be waited (refresh address relief evaluation, and external address relief evaluation) by a relief evaluation time. After the present invention is applied, an internal counter address, which is a regular address incremented at a certain timing, is known before execution of a refresh cycle. Therefore, in the period during which a refresh at the counter address is being executed, relief evaluation for a next counter address is made and its result is latched in the latch (1), and for a refresh at the counter address, a result latched during evaluation in the preceding cycle is propagated to the latch (2) and propagated to the predecoder with time match with the refresh address. Thereby, time required for refresh address relief evaluation (refresh address relief evaluation) can be concealed and cycle time can be shortened.

Figure 4:
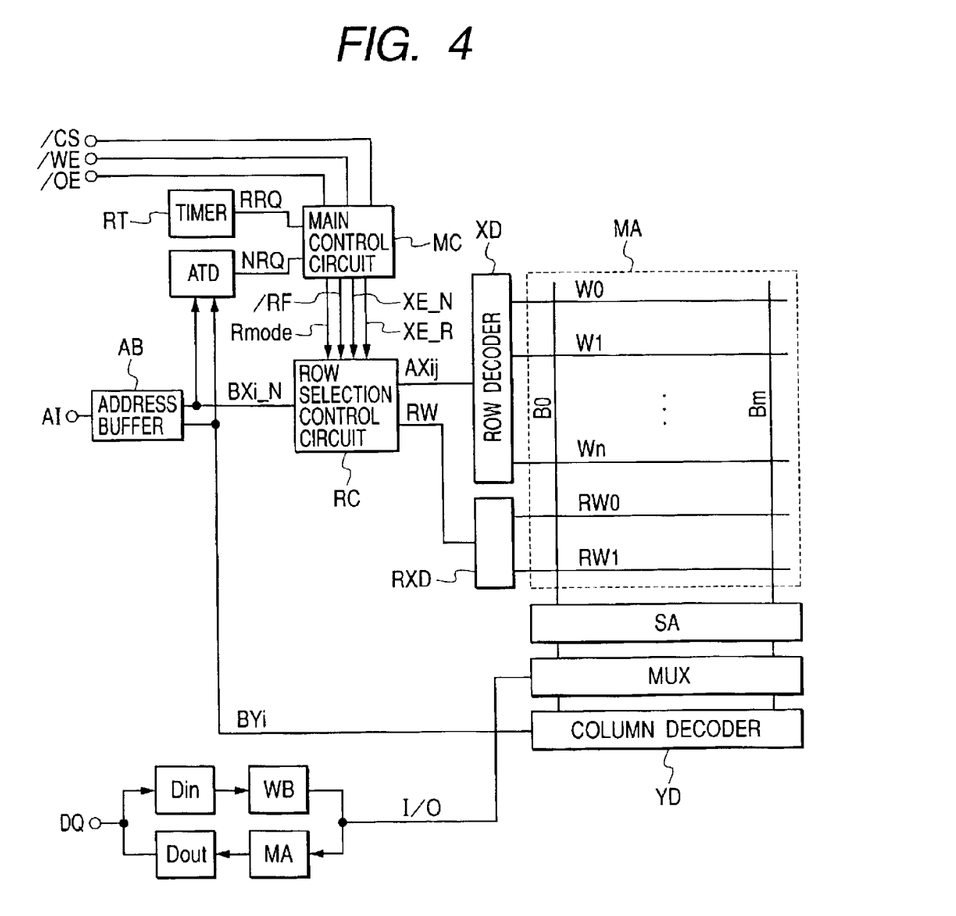
FIG. 4 is a schematic block diagram showing another embodiment of a DRAM according to the present invention.

FIG. 4 is a schematic block diagram of one embodiment of a DRAM according to the present invention. A DRAM of this embodiment is intended for a so-called pseudo SRAM, which is a DRAM having an SRAM interface. In the drawing, RC denotes a row-system selection control circuit of the present invention, which includes components in the embodiment shown in FIG. 1, such as the redundancy relief circuit 10, latch controls 11 and 12, relief result latch circuits 13 to 15, BX buffer circuit 9, BX selector, relief result output control circuit 16, predecoder, and refresh address counter for generating a current refresh address and a next refresh address.

AB denotes an address buffer circuit that receives an external address signal Ai and generates an internal row address signal BXi_N and internal column address signal BYi. ATD denotes an address transition detecting circuit that detects a change of the internal address signals BXi_N and BYi and outputs an access request signal NRQ. RT denotes a refresh timer that outputs a refresh request signal RRQ periodically (every several µs).

MC denotes a main control circuit that receives signals NRQ and RRQ, chip select signal CS, write enable signal WE, output enable signal OE, and other signals (commands), and arbitrates execution order of read/write and refresh. The main control circuit MC outputs a refresh mode signal Rmode, refresh signal RF, timing signals XE_N and XE_R. These signals are used within the row-system selection control circuit RC.

XD denotes a row decoder and RXD denotes a redundant word line decoder. MA denotes a memory array in which known transistor-type dynamic memory cells (storage capacitors and address selection MOSFET) are disposed in intersections of word lines W0 to Wn and redundant word lines RW0 and RW1, and bit lines B0 to Bm. Redundant bit lines, which are omitted in the drawing, may be provided as required.

SA denotes a sense amplifier that amplifies a signal read onto a bit line, YD denotes a column decoder that receives a column address signal BYi and selects one bit line, MUX denotes a multiplexer for connecting a selected bit line to an input-output data line I/O, MA denotes a main amplifier, Dout denotes a data output buffer, Din denotes a data input buffer, WB denotes a write buffer, and DQ denotes an data input-output terminal. I/O, MA, Dout, Din, WB, and DQ are respectively shown only one in the drawing but may be plural (e.g., 4 to 16).

Although there is no particular limitation, if signal NRQ is outputted earlier than RRQ, a read or write is executed earlier and, after its termination, a refresh is executed. In this case, for a read, data on a bit line selected by the column decoder is read onto I/O through the multiplexer MUX and outputted to the data input-output terminal DQ through the main amplifier MA and the data output buffer Dout. For a write, data inputted from the data input-output terminal DQ is written to a memory cell through the data input buffer Din, the write buffer WB, I/O, the multiplexer MUX, and a selected bit line.

Conversely, if signal RRQ is outputted earlier than NRQ, a refresh is executed earlier, and after its termination, a read or write is executed. During the refresh, the sense amplifier operates but the column decoder and circuits related to input and output do not operate. The above operations make it possible to conceal a refresh operation from the outside.

Figure 5:
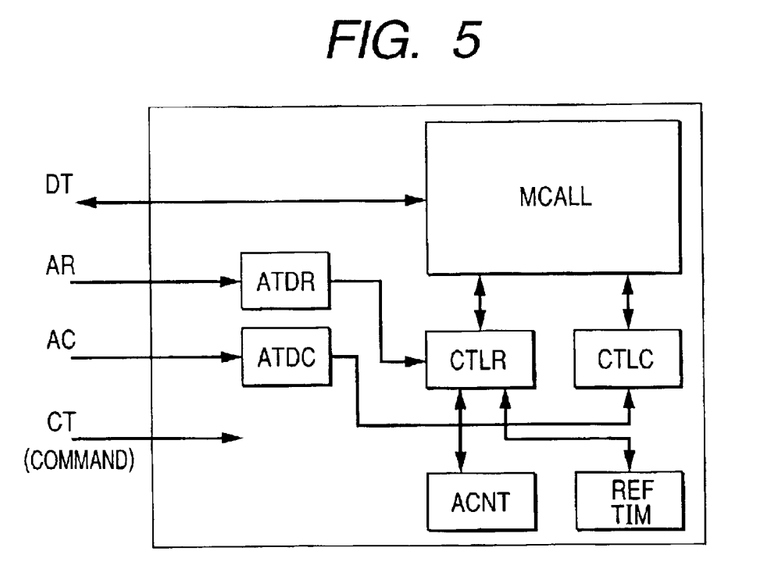
FIG. 5 is a schematic block diagram of another embodiment of the DRAM according to the present invention.

FIG. 5 is a schematic block diagram of another embodiment of the DRAM according to the present invention. A DRAM of this embodiment is intended for the same pseudo SRAM in FIG. 4. A memory circuit MACLL is provided corresponding to plural bit lines and plural word lines and includes plural memory cells periodically requiring a refresh operation for holding stored information. The memory cells each comprise a capacitor for storing information and an address selection MOSFET. The gate of an address selection MOSFET is connected to the above described word line and, and one of a route between the source and the drain is connected to the above described bit line and the other of the route is connected to a storage node of the capacitor for storing information.

The above described bit lines are paired and coupled to input-output nodes of the sense amplifier comprising a differential latch circuit. By a word line selection operation, a memory cell is connected to one of a bit line pair and is not connected to another bit line. The sense amplifier uses as a reference voltage a precharge voltage of the bit line to which the memory cell is not connected, and amplifies to a high level and a low level a minute potential difference with a read signal read into the bit line to which the memory cell is connected, thereby performing a rewrite operation (or a refresh operation) to restore the state of an electrical charge of the storage capacitor that is being lost due to a word line selection operation, to its original state. As such a construction, the same construction as that of a known dynamic RAM can be used.

To select word lines and bit lines of the memory circuit MACLL, there are provided a row address transition detecting circuit ATDR and a column address transition detecting circuit ATDC. The row address transition detecting circuit is supplied with a row address signal ADR and the column address transition detecting circuit is supplied with a column address signal ADC. A data signal DT is write data inputted to the memory circuit MACLL and read data outputted from the memory circuit MACLL. A signal CT is a control signal for write/read control operations, chip selection, and the like.

An output signal of the row address transition detecting circuit ATDR is inputted to a row-system control circuit CTLR to generate row-system pass timing and column-system start timing. An output signal of the column address transition detecting circuit ATDC is inputted to a column-system control circuit CTLC to generate column-system pass timing. According to timings generated by the control circuits CTLR and CTLC, access to the memory circuit MCALL is carried out. Thereby, upon transition of only the column address signal ADC, the column system can be controlled independently, and input and output operations can be performed, in page mode, on word lines selected by preceding row address selection operations.

The dynamic memory cells as described above lose in information charges held in storage capacitors with time. Accordingly, with the dynamic memory cells, before the information charges are lost, a read operation must be performed to restore them to their original charge states. This is called a refresh operation. The refresh timer REFTIM forms a signal for a period of time corresponding to the information holding capability of the memory cells. An output signal of the refresh timer REFTIM is inputted to the row-system control circuit CTLR and performs a refresh operation at an address specified by a refresh address counter ACNT. It also counts up the refresh address counter ACNT.

The row-system control circuit CTLR detects transition of the external row address signal ADR, that is, either an output signal of the row address transition detecting circuit ATDR or an output signal of the internal refresh timer REFTIM, whichever occurs earlier, and performs control so that a normal memory access or refresh operation is performed, and then no operation is performed. Thereby, since possible conflict between an internal refresh operation and an external access causes no problem, the need for external refresh requests can be eliminated.

Also in this embodiment, the row-system control circuit CTLR includes components in the embodiment shown in FIG. 1, such as the redundancy relief circuit 10, latch controls 11 and 12, relief result latch circuits 13 to 15, BX buffer circuit 9, BX selector, relief result output control circuit 16, predecoder, and refresh address counter ACNT for generating a current refresh address and a next refresh address.

Figure 6:
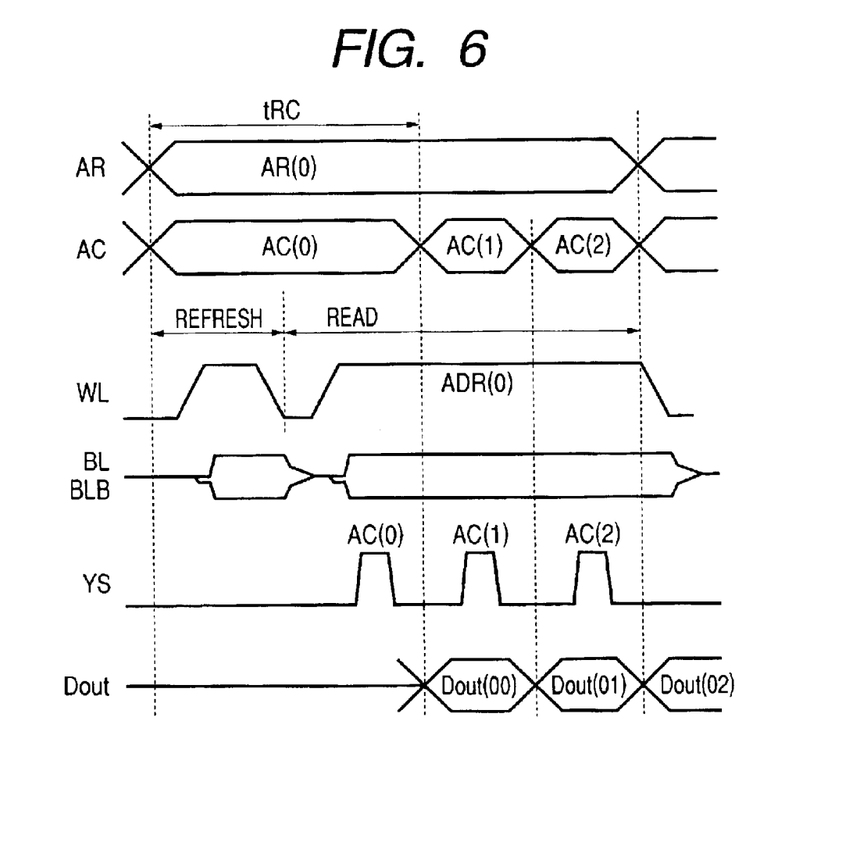
FIG. 6 is a schematic timing diagram for explaining operations of the embodiment of FIG. 5.

FIG. 6 is a schematic timing diagram for explaining operations of the embodiment of FIG. 5. The drawing shows an example of a case where an internal refresh request is detected earlier than transition of an address signal AR. After a refresh operation, that is, after a pair of bit lines BL and BLB changes to a high level and a low level according to memory cell storage information by word line WL selection and sense amplifier operation by the refresh operation (Refresh), and the refresh operation as described previously is performed, the word line WL once goes into a non-selection state of low level and the bit lines BL and BLB are reset (precharged). A word line WL is selected (Read) correspondingly to the address signal AR(0), and a column selection signal YS (AC(0)) is formed correspondingly to the address signal AC(0).

Such a refresh operation and read operation initiation are executed within one cycle (tRC). As a result, the internal refresh operation is concealed from the outside. Therefore, the need for external refresh requests is eliminated and SRAM interface compatibility can be achieved using the memory circuit MACLL composed of the dynamic memory cells as described above.

After the one cycle (tRC), a read signal Dout(0) is outputted by a column selection signal YS (AC(0)) corresponding to the column address signal AC(0), and when only the column address signal (AC) changes (AC(0)→AC(1)), the word line WL remains activated (non-selection state) and a column selection signal YS (AC(1)) corresponding to a page address is formed, and data Dout(01) is read. Thereafter, when only the column address signal (AC) changes (AC(1)→AC(2)), likewise, the column selection signal YS (AC(2)) is formed and Dout(02) is read.

When a row address signal AR changes (AR(0)→AR(1)), a word line WL corresponding to the row address signal AR(0) is inactivated and a word line WL corresponding to a row address signal AR(1) is activated. In this way, in a period during which only the column address signal changes, since a cycle depends on access to the column selection signal YS and a read time from the column selection signal YS, a read can be made faster than in the one cycle tRC including a word line selection operation and a sense amplifier amplifying operation.

When a refresh request lags behind an output signal of the address transition detecting circuit ATDR, after termination of a relevant cycle (including a page mode period), a word line is inactivated, and then a word line WL is selected by a refresh address to perform a refresh operation. In this case, although the refresh operation extends to a next cycle, since the refresh operation and a read operation can be performed within one cycle tRC, there is no problem. Also for a write operation, like the above described read operation, it can be allocated in terms of time to internally perform a refresh operation. In the above described refresh operation, refresh address relief evaluation is made in a preceding cycle as in the above described embodiment, reducing time required for the refresh operation.

Although the foregoing description is made of an example of applying the present invention to a pseudo SRAM, the present invention can apply to not only a pseudo SRAM but also a normal DRAM. However, a pseudo SRAM has more effects in application of the present invention because of reduction in refresh cycle time leads directly to reduction in access time.

Figure 7A:
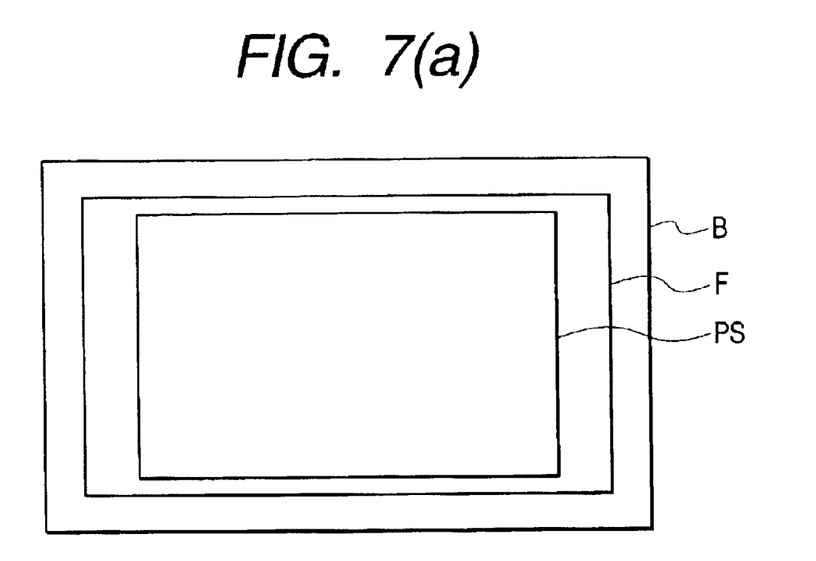
FIGS. 7A and 7B are diagrams showing a configuration of one embodiment of a pseudo SRAM according to the present invention.
Figure 7B:
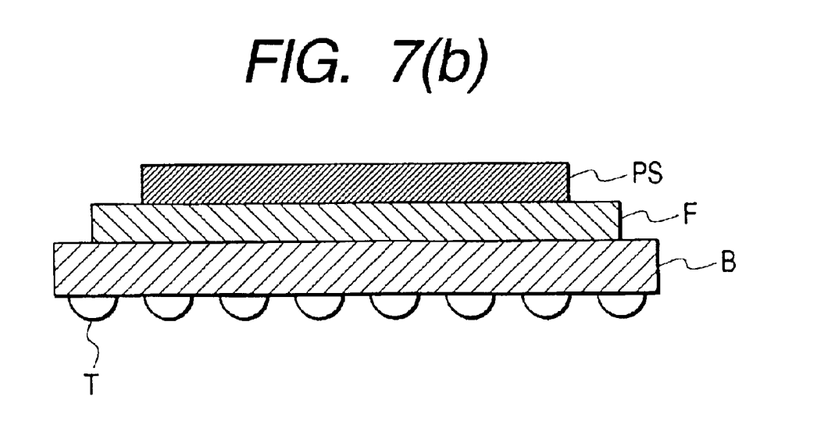

FIG. 7 is a diagram showing a configuration of one embodiment of a pseudo SRAM according to the present invention. FIG. 7A shows a planar portion thereof and FIG. 7B shows a sectional portion thereof. A semiconductor memory of this embodiment is an embodiment called a stacked CSP (Chip Size Package) and has two semiconductor chips respectively constituting a flash memory F and a pseudo SRAM (PS) stacked on a substrate B. T denotes an external terminal such as a solder ball. For simplicity, bonding wires are omitted in the drawing.

An address signal and an input-output signal are connected to a terminal common to the flash memory F and the pseudo SRAM (PS). On the other hand, a command signal is connected to different terminals for the flash memory F and the pseudo SRAM. This makes it possible to bring only one of the flash memory F and the pseudo SRAM into operation. By constituting two memories as one semiconductor memory, the flash memory F and the pseudo SRAM can be used differently for different purposes in such a way that data that must not be volatilized is stored on the flash memory F and other data is stored on the pseudo SRAM, or before turning power off, data stored on the pseudo SRAM that must not be volatilized can be transferred to the flash memory for storage.

Effects obtained from the above described embodiments are as described below.

(1) In a semiconductor memory which includes normal memory cells provided at predetermined intersections of plural normal word lines and plural bit lines, and redundant memory cells provided at predetermined intersections of redundant word lines and the plural bit lines, and in which a redundancy relief circuit evaluates whether each of an internal address signal for a memory operation and a refresh address signal corresponds to the address of a defective word line of the plural normal word lines, and an address selecting circuit switches the defective word line occurring in the normal word line to a redundant word line according to the evaluation result, the redundancy relief circuit evaluates whether a refresh address added by one to the refresh address signal corresponds to a defective address, and during a refresh operation, the address selecting circuit selects a normal word line or redundant word line according to the evaluation result in a preceding cycle. With this construction, refresh time can be reduced.

(2) The normal memory cells and the redundant memory cells are configured with dynamic memory cells each comprising a MOSFET for selecting an address and a capacitor for storing information. With this construction, a large storage capacity can be obtained and bit costs can be reduced.

(3) First and second refresh address relief result latches operating according to a timing signal associated with the refresh operation are used, and in response to the timing signal, an evaluation result of the first refresh address relief result latch is transferred to the second refresh address relief result latch, and an evaluation result formed by the redundancy relief circuit is got into the first refresh address relief result latch, and the address selecting circuit can obtain the corresponding evaluation result.

(4) There are further provided a timer for measuring a time interval to perform a refresh operation to output a refresh request signal, and an arbitrating circuit for arbitrating the refresh request and access request. With this construction, since write/read operations can be performed without considering a refresh operation, the semiconductor memory can be used like a static RAM.

(5) By further providing a second semiconductor chip stacked on a first semiconductor chip on which the semiconductor memory is formed, a semiconductor memory having multiple functions can be obtained.

(6) By providing the second semiconductor chip with a nonvolatile memory, necessary data can be stored in the nonvolatile memory.

(7) In a semiconductor memory which includes plural normal memory cells coupled to plural normal word lines, plural redundant memory cells coupled to redundant word lines, and a refresh address signal generating circuit, and in which the plural normal memory cells and the plural redundant memory cells require a refresh operation, a cycle is determined based on a refresh period and an access period, a redundancy evaluation circuit evaluates whether each of an internal address signal and a refresh address signal corresponds to the address of a defective word line of the plural normal word lines, and an address selecting circuit switches the defective word line occurring in the normal word line to a redundant word line, the redundancy relief circuit evaluates whether a refresh address added by one to the refresh address signal corresponds to a defective address, and during a refresh operation, the address selecting circuit selects a normal word line or redundant word line according to the evaluation result in a preceding cycle. With this construction, refresh time can be reduced.

(8) The normal memory cells and the redundant memory cells are configured with dynamic memory cells each comprising a MOSFET for selecting an address and a capacitor for storing information. With this construction, the semiconductor memory can be substituted for a static RAM, a large storage capacity can be obtained, and bit costs can be reduced.

(9) The plural normal memory cells and the plural redundant memory cells are configured with dynamic memory cells to form refresh concealment memories not requiring external refresh requests. With this construction, the semiconductor memory can be substituted for a static RAM, a large storage capacity can be obtained, and bit costs can be reduced.

(10) In a semiconductor memory which includes plural normal memory cells coupled to plural normal word lines, plural redundant memory cells coupled to redundant word lines, and a refresh address signal generating circuit, and in which the plural normal memory cells and the plural redundant memory cells require a refresh operation, a cycle is determined based on the sum of a refresh period and an access period, a redundancy evaluation circuit evaluates whether each of an internal address signal and a refresh address signal corresponds to the address of a defective word line of the plural normal word lines, and an address selecting circuit switches the defective word line occurring in the normal word line to a redundant word line, the redundancy relief circuit evaluates whether a refresh address added by one to the refresh address signal corresponds to a defective address, and during a refresh operation, the address selecting circuit selects a normal word line or redundant word line according to the evaluation result in a preceding cycle. With this construction, refresh time can be reduced.

The invention made by the present inventor has been described in detail, based on preferred embodiments. The present patent application is not limited to the embodiments and may be modified in various ways without departing from the spirit and scope of the present invention. For example, a memory array may be split to plural pieces in bit line direction and word line direction, and an address selecting circuit may be provided for each of the split memory cell arrays. Word lines and bit lines may be respectively formed with a hierarchical word line system comprising main word lines and local word lines, and a hierarchical bit line system comprising local bit lines and main bit In other words, using known element structure and circuit layout technologies employed for dynamic RAMs, the memory cell arrays and the address selecting circuit can be formed. As in the embodiment, a synchronous pseudo SRAM having refresh concealment plus page mode, and refresh concealment plus DRAM interface (address multiple and RAS/CAS control) can be formed.

As electronic equipment such as cellular phones grows more sophisticated, there are rapidly increasing demands for large-capacity work RAM. Usually, a work RAM is configured with an asynchronous SRAM but is not intended to have a large capacity. A large-capacity DRAM that is in the limelight as an alternative memory to the work RAM requires refresh inconveniently for use. A semiconductor memory according to the present invention can maintain compatibility with an asynchronous SRAM and can be configured integrally with the flash memory to exhibit various operations in combination with the flash memory having nonvolatile information functions at power off. The present invention can be widely used as a semiconductor memory using DRAM circuits that can be handled as it were an SRAM as viewed from the outside.

The following describes effects of typical inventions of those disclosed by the present patent application. In a semiconductor memory which includes normal memory cells provided at predetermined intersections of plural normal word lines and plural bit lines, and redundant memory cells provided at predetermined intersections of redundant word lines and the plural bit lines, and in which a redundancy relief circuit evaluates whether each of an internal address signal for a memory operation and a refresh address signal corresponds to the address of a defective word line of the plural normal word lines, and an address selecting circuit switches the defective word line occurring in the normal word line to a redundant word line according to the evaluation result, the redundancy relief circuit evaluates whether a refresh address added by one to the refresh address signal corresponds to a defective address, and during a refresh operation, the address selecting circuit selects a normal word line or redundant word line according to the evaluation result in a preceding cycle. With this construction, refresh time can be reduced.

What is claimed is:

1. A semiconductor memory comprising:
   a plurality of normal word lines;
   a plurality of redundant word lines;
   a plurality of bit lines;
   a plurality of normal memory cells provided at intersections between said plurality of normal word lines and said plurality of bit lines, and a plurality of redundant memory cells provided at intersections between said plurality of redundant word lines and said plurality of bit lines;
   an address input circuit that generates an internal address signal;
   an address counter that generates a refresh address signal for successively refreshing said plurality of normal word lines;
   a redundancy relief circuit that evaluates whether each of said internal address signal and said refresh address signal corresponds to the address of a defective word line of said plurality of normal word lines; and
   an address selecting circuit that switches the defective word line occurring in the normal word line to the redundant word line according to the evaluation result of said redundancy relief circuit, wherein said redundancy relief circuit evaluates whether a refresh address added by one to the refresh address signal corresponds to a defective address, and wherein, during a refresh operation, said address selecting circuit selects a normal word line or redundant word line according to the evaluation result of said redundancy relief circuit in a preceding cycle.

2. The semiconductor memory according to claim 1, wherein the normal memory cells and the redundant memory cells are dynamic memory cells each comprising a MOSFET for selecting an address and a capacitor for storing information.

3. The semiconductor memory according to claim 2, further including first and second refresh address relief result latches operating according to a timing signal associated with the refresh operation, wherein, in response to the timing signal, an evaluation result of the first refresh address relief result latch is transferred to the second refresh address relief result latch, and an evaluation result formed by the redundancy relief circuit is taken into the first refresh address relief result latch, and wherein the evaluation result in the preceding cycle is transferred to the address selecting circuit from the second refresh address relief result latch.

4. The semiconductor memory according to claim 3, further including a timer for measuring a time interval to perform a refresh operation to output a refresh request signal, and an arbitrating circuit for arbitrating the refresh request and access request.

5. The semiconductor memory according to claim 4, further including:

a first semiconductor chip on which the semiconductor memory is formed; and a second semiconductor chip stacked on the first semiconductor chip.

6. The semiconductor memory according to claim 5, wherein the second semiconductor chip is provided with a nonvolatile memory.

7. A semiconductor memory in which a cycle is determined based on the sum of a refresh period and an access period, comprising:

a plurality of normal word lines;

a plurality of normal dynamic memory cells coupled to said plurality of normal word lines;

a plurality of redundant word lines;

a plurality of redundant dynamic memory cells coupled to said plurality of redundant word lines, said plurality of normal dynamic memory cells and said plurality of redundant dynamic memory cells requiring a refresh operation;

a refresh address control circuit, a relief circuit that evaluates whether an internal address signal and a refresh address signal indicates the address of a defective word line of said plurality of normal word lines; and an address selecting circuit that can switch, in response to the evaluation result of said relief circuit, the defective word line of said plurality of normal word line to a redundant word line, wherein said relief circuit evaluates whether the refresh address signal added by one to the inputted refresh address signal is a defective address, and wherein, during a refresh operation in a predetermined cycle, the address selecting circuit selects a normal word line or redundant word line according to the evaluation result of said relief-circuit in a cycle preceding said predetermined cycle.

* * * * *